(12) United States Patent
Trutna, Jr. et al.

(10) Patent No.: US 7,276,892 B2
(45) Date of Patent: Oct. 2, 2007

(54) RESONATOR BASED SPECTRUM ANALYZER AND METHOD

(75) Inventors: William Richard Trutna, Jr., Atherton, CA (US); Steven Rosenau, Mountain View, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/119,285

(22) Filed: Apr. 29, 2005

(65) Prior Publication Data

US 2006/0244436 A1 Nov. 2, 2006

(51) Int. Cl.
*G01R 23/00* (2006.01)
*G01R 9/00* (2006.01)

(52) U.S. Cl. .............. 324/76.19; 324/76.49; 324/76.22; 310/324; 333/189

(58) Field of Classification Search ........ 333/219–235; 324/76.19, 76.22, 636, 76.49
See application file for complete search history.

(56) References Cited

U.S. PATENT DOCUMENTS

| 5,587,620 | A | 12/1996 | Ruby et al. |
| 5,608,360 | A | 3/1997 | Driscoll |
| 5,870,351 | A * | 2/1999 | Ladabaum et al. ......... 367/163 |
| 5,873,153 | A | 2/1999 | Ruby et al. |
| 5,883,575 | A * | 3/1999 | Ruby et al. ............. 340/572.5 |
| 6,420,820 | B1 | 7/2002 | Larson, III |
| 6,507,983 | B1 | 1/2003 | Ruby et al. |
| 6,550,664 | B2 | 4/2003 | Bradley et al. |
| 6,600,390 | B2 | 7/2003 | Frank |
| 6,833,754 | B2 * | 12/2004 | Lancaster ................... 327/551 |
| 6,870,445 | B2 | 3/2005 | Kawakubo et al. |
| 6,946,928 | B2 * | 9/2005 | Larson et al. ............... 333/189 |

OTHER PUBLICATIONS

Dubois, Mark-Alexandre. "Thin Film Bulk Acoustic Wave Resonators: A Technology Overview." MEMSWAVE 03, Toulous, France, Jul. 2-4, 2003.

* cited by examiner

*Primary Examiner*—Walter Benson
*Assistant Examiner*—John Zhu

(57) ABSTRACT

A spectrum analyzer includes an array of frequency-selective bulk acoustic wave (BAW) resonators each tuned to a predetermined different resonant frequency. The spectrum analyzer further includes a broadband BAW resonator that generates acoustic energy when connected to a signal source. An acoustic coupling transmits the acoustic energy generated by the broadband BAW resonator to the frequency-selective BAW resonators so that one of the frequency-selective BAW resonators will generate an electrical output signal if the acoustic energy transmitted from the broadband BAW resonator contains spectral components at its predetermined resonant frequency.

20 Claims, 1 Drawing Sheet

RESONATOR BASED SPECTRUM ANALYZER AND METHOD

BACKGROUND

Measurement of energy emanating from a radiator in the radio frequency (RF) portion of the electromagnetic spectrum is fundamental to RF circuit design. RF spectrum analyzers have been commercially available for many years. They are essentially superheterodyne radio receivers with a swept local oscillator to tune the receiver across the spectral region of interest. Such spectrum analyzers are sensitive and accurate, but they are expensive and bulky and consume a relatively large amount of power.

SUMMARY

In accordance with an embodiment of the invention, a spectrum analyzer includes an array of frequency-selective bulk acoustic wave (BAW) resonators, each tuned to a predetermined different resonant frequency. The spectrum analyzer further includes a broadband BAW resonator that generates acoustic energy when connected to a signal source. An acoustic coupling transmits the acoustic energy generated by the broadband BAW resonator to the frequency-selective BAW resonators so that one of the frequency-selective BAW resonators will generate an electrical output signal if the acoustic energy transmitted from the broadband BAW resonator contains spectral components at its predetermined resonant frequency.

In accordance with another embodiment of the invention, a method of performing spectrum analysis of an electromagnetic signal includes the step of applying an electromagnetic signal to a broadband bulk acoustic wave (BAW) resonator to generate acoustic energy. The method further includes the step of applying the acoustic energy to a plurality of frequency-selective BAW resonators each tuned to a different resonant frequency so that one of the frequency-selective BAW resonators will generate an electrical signal if the acoustic energy generated by the broadband BAW resonator contains spectral components at its predetermined resonant frequency.

DETAILED DESCRIPTION

In accordance with an embodiment of the invention, a novel low-power, compact spectrum analyzer is provided that is ideally suited to situations in which only a relatively low-resolution spectral measurement is required. Since the compact spectrum analyzer can be manufactured at relatively low cost, it permits relatively low cost measurements in a wide variety of applications.

A compact spectrum analyzer in accordance with an embodiment of the invention is connectable to an antenna or other RF signal source, which samples the RF environment, and an electrical circuit containing a plurality of resonant elements, preferably in the form of thin film bulk acoustic resonators (FBARs). Suitable FBARs are commercially available from Agilent Technologies, Inc., the assignee of the subject application. See U.S. Pat. Nos. 5,587,620; 5,873,153; 5,883,575; 6,420,820; 6,507,983; and 6,550,664.

The compact spectrum analyzer and method of the present invention can be practiced with various types of bulk acoustic wave (BAW) piezoelectric resonators including solidly mounted resonators (SMRs) in addition to FBARs. It will be understood by those skilled in the art that the simplest configuration of a BAW resonator is two metal electrodes sandwiching a thin film of piezoelectric material and that FBARs and SMRs are two species of the broader device known as a BAW resonator.

Figure 1:
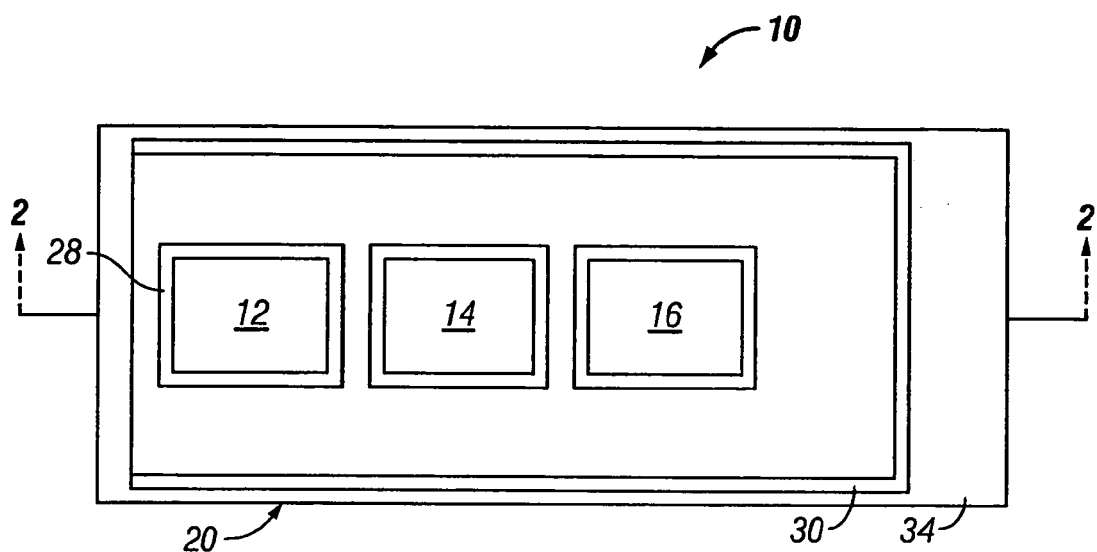
FIG. 1 is a top plan view of a spectrum analyzer in accordance with the invention.
Figure 2:
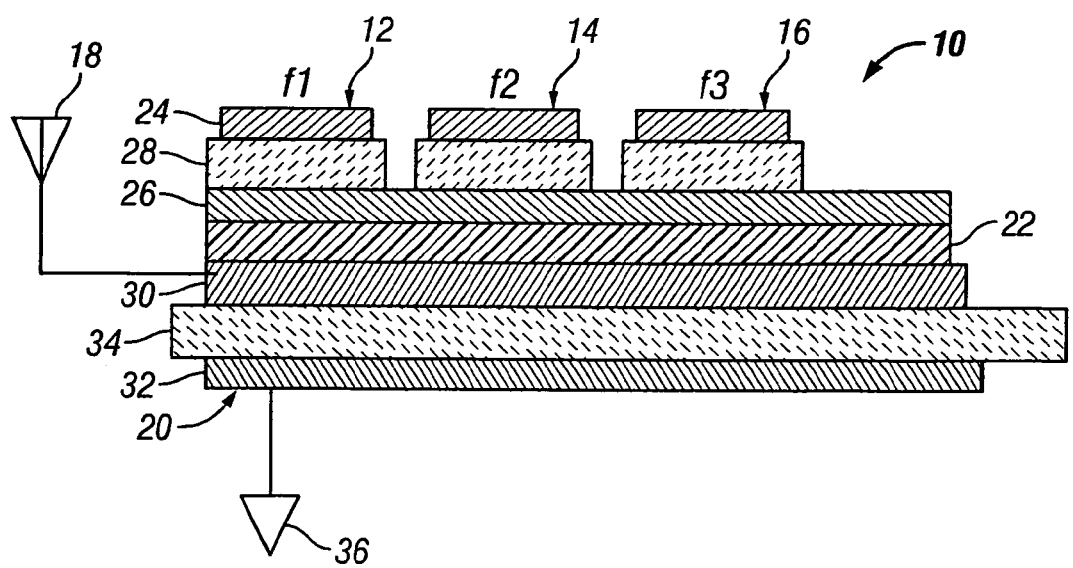
FIG. 2 is a vertical cross-sectional view of the spectrum analyzer of FIG. 1 taken along line 2-2 of FIG. 1. Also shown diagrammatically in this figure are an antenna and a ground connection.

Referring to FIGS. 1 and 2, a compact spectrum analyzer 10 in accordance with an embodiment of the invention includes an array of laterally spaced apart, frequency-selective FBARs 12, 14 and 16, each tuned to a slightly different frequency. The different resonant frequencies of the FBARs 12, 14 and 16 are labeled f1, f2 and f3, respectively, in FIG. 2. The number and frequency spacing of frequency-selective FBARs is selected to cover a predetermined desired frequency range. The RF signal is collected from antenna 18 (FIG. 2) and is used to excite relatively larger broadband FBAR 20, which underlies the array of relatively smaller frequency-selective FBARs 12, 14 and 16. Of course the RF signal need not be supplied from antenna 18 but could be supplied by another source, such as a co-axial cable. Broadband FBAR 20 could overlie the array of frequency-selective FBARs, so long as broadband FBAR 20 is substantially coextensive with the width of the array.

The RF signal from antenna 18 is converted by broadband FBAR 20 (FIG. 2) to an acoustic signal. The acoustic signal propagates from broadband FBAR 20 through an acoustic coupling in the form of sound transmitting layer 22 to frequency-selective FBARs 12, 14 and 16 positioned above broadband FBAR 20. If the acoustic energy transmitted from the broadband FBAR 20 contains spectral components at the resonant frequency f1, f2 or f3 of one of the frequency-selective FBARs 12, 14 or 16, then a portion of the acoustic energy is converted back to an electrical output signal, which can be sensed by a detector and amplifier (not illustrated). If there are no frequency components at the resonant frequency of any of the frequency-selective FBARs 12, 14 and 16, then no electrical output signal is generated.

The array of frequency-selective FBARs 12, 14 and 16 is used to produce a discrete sampling of the RF spectrum in the frequency range of interest. The resonator Q sets the frequency resolution, while the spacing and the number of resonator frequencies determines the frequency sample interval and the frequency range.

Frequency-selective FBARs 12, 14 and 16 have a similar construction so only one need be described. FBAR 12, for example, includes top and bottom metal electrodes 24 and 26 that sandwich thin film piezoelectric membrane 28. Bottom electrode 26 is much larger than top electrode 24 and serves as a common bottom electrode for all of the frequency-selective FBARs 12, 14 and 16 in the array. The preferred materials for frequency-selective FBARs 12, 14 and 16 are well known to those skilled in the art, and in general, should have a reasonably high electromechanical coupling constant and low dielectric constant. By way of example, the electrodes may be made of Al, although Mo, Ti or W are preferred because of their low thermo-elastic losses. By way of further example, the piezoelectric material may be Aluminum nitride (AlN), however, ZnO and lead zirconate titantate (PZT) may also be used. In general, piezoelectric membrane 28 should have good thermal conductivity.

Broadband FBAR 20 has a construction similar to that of frequency-selective FBARs 12, 14 and 16. Broadband FBAR 20 includes top and bottom metal electrodes 30 and 32 that sandwich thin film piezoelectric membrane 34. Again electrodes 30 and 32 may be made of Al, although Mo, Ti or W are preferred. Similarly, the preferred material for piezoelectric membrane 34 is aluminum nitride (AlN), however, ZnO and lead zirconate titantate (PZT) may also be used.

If broadband FBAR 20 is not detached from its substrate during fabrication, the substrate losses broaden the resonance. The thickness of piezoelectric membrane 34 can be varied so that different parts of the structure resonante at differenent frequencies. However, the capacitive loading of the non-resonant portions of the structure may reduce efficiency.

Antenna 18 is connected to top electrode 30. Lower electrode 32 has a ground connection 36.

Acoustic coupling 22 is preferably made of polyimide. Alternatives include $SiO_2$, Aluminum, and Al2O3. It is important that acoustic coupling 22 be compatible with the fabrication techniques used to build the FBARs. Acoustic coupling 22 is sandwiched between the upper frequency-selective FBARs 12, 14 and 16 and the lower broadband FBAR 20, which are physically attached to the upper and lower surfaces of acoustic coupling 22, respectively.

Conventional integrated circuit fabrication techniques can be used to manufacture compact spectrum analyzer 10 in high volumes at relatively low cost. Its monolithic structure is well suited to utilize the various vapor deposition, sputtering, photolithography and etching techniques widely practiced today in fabricating micro-electronic devices. A plurality of compact spectrum analyzers 10 may be built up on top of a silicon wafer (not illustrated) on which a $Si_3N_4$ layer has first been deposited. The completed compact spectrum analyzer can be made relatively small and may be placed within a hermetically sealed package (not illustrated).

In accordance with another embodiment of the invention, a method of performing spectrum analysis of an electromagnetic signal includes the step of applying an electromagnetic signal to a broadband bulk acoustic wave (BAW) resonator to generate acoustic energy. The method further includes the step of applying the acoustic energy to a plurality of frequency-selective BAW resonators each tuned to a different resonant frequency so that one of the frequency-selective BAW resonators will generate an electrical signal if the acoustic energy generated by the broadband BAW resonator contains spectral components at its predetermined resonant frequency.

While an embodiment of a compact spectrum analyzer in accordance with an embodiment of the invention, and a method of performing spectrum analysis in accordance with another embodiment of the invention have been described, variations and modifications thereof will occur to those skilled in the art. For example, resistive heaters may be provided to alter the temperature of frequency-selective FBARs 12, 14 and 16 over a range of approximately 200 degrees C., thereby shifting their resonant frequencies f1, f2 and f3 by approximately four percent. A compact spectrum analyzer can be made in accordance with the present invention that is sensitive to other regions of the electromagnetic spectrum besides the RF range. Therefore the protection afforded the invention should only be limited in accordance with the following claims.

The invention claimed is:

1. A spectrum analyzer, comprising:
   an array of frequency-selective bulk acoustic wave (BAW) resonators, each tuned to a predetermined different resonant frequency;
   a broadband BAW resonator that generates acoustic energy when connected to a signal source; and
   an acoustic coupling for transmitting the acoustic energy generated by the broadband BAW resonator to the frequency-selective BAW resonators so that one of the frequency-selective BAW resonators will generate an electrical output signal if the acoustic energy transmitted from the broadband BAW resonator contains spectral components at its predetermined resonant frequency.

2. The spectrum analyzer of claim 1 wherein the broadband BAW resonator converts an RF signal into acoustic energy.

3. The spectrum analyzer of claim 1 wherein the broadband BAW resonator underlies the array of frequency-selective BAW resonators.

4. The spectrum analyzer of claim 1 and further comprising an antenna connected the broadband BAW resonator as the signal source.

5. The spectrum analyzer of claim 1 wherein the acoustic coupling is a layer of material selected from the group consisting of polyimide, $SiO_2$, Aluminum, and Al2O3 sandwiched between the array of frequency-selective BAW resonators and the broadband BAW resonator.

6. The spectrum analyzer of claim 1 wherein the frequency-selective BAW resonators share a common electrode.

7. The spectrum analyzer of claim 1 wherein each of the frequency-selective BAW resonators includes a top electrode and bottom electrode sandwiching a piezoelectric membrane.

8. The spectrum analyzer of claim 1 wherein the broadband BAW resonator includes a top electrode and bottom electrode sandwiching a piezoelectric membrane.

9. The spectrum analyzer of claim 1 and further comprising a ground connection to an electrode of the broadband BAW resonator.

10. The spectrum analyzer of claim 1 wherein the BAW resonators each include top and bottom electrodes made of a metal selected from the group consisting of Al, Mo, Ti or W and a membrane of piezoelectric material sandwiched between the electrodes selected from the group consisting of aluminum nitride (AlN), ZnO and lead zirconate titantate (PZT).

11. A spectrum analyzer, comprising:
    a plurality of frequency-selective film bulk acoustic resonators (FBARs), each having a predetermined different resonant frequency;
    a broadband FBAR that generates acoustic energy when a radio frequency (RF) signal is applied thereto; and
    an acoustic coupling sandwiched between the frequency selective FBARs and the broadband FBAR for transmitting the acoustic energy generated by the broadband FBAR to the frequency-selective FBARs.

12. The spectrum analyzer of claim 11 wherein the broadband FBAR underlies the array of frequency-selective FBARs.

13. The spectrum analyzer of claim 11 and further comprising an antenna connected the broadband FBAR as the signal source.

14. The spectrum analyzer of claim 11 wherein the acoustic coupling is made from a material selected from the group consisting of polyimide, SiO$_2$, Aluminum, and Al2O3.

15. The spectrum analyzer of claim 11 wherein each of the frequency-selective FBARs includes a top electrode and bottom electrode sandwiching a piezoelectric membrane.

16. The spectrum analyzer of claim 11 wherein the broadband FBAR includes a top electrode and bottom electrode sandwiching a piezoelectric membrane.

17. The spectrum analyzer of claim 11 and further comprising a ground connection to an electrode of the broadband FBAR.

18. The spectrum analyzer of claim 11 wherein the FBARs each include top and bottom electrodes made of a metal selected from the group consisting of Al, Mo, Ti or W and a membrane of piezoelectric material sandwiched between the electrodes selected from the group consisting of aluminum nitride (AlN), ZnO and lead zirconate titantate (PZT).

19. The spectrum analyzer of claim 11 wherein one of the frequency-selective FBARs will generate an electrical output signal if the acoustic energy transmitted from the broadband FBAR contains spectral components at its predetermined resonant frequency.

20. A method of performing spectrum analysis of an electromagnetic signal, comprising the steps of:
  applying an electromagnetic signal to a broadband bulk acoustic wave (BAW) resonator to generate acoustic energy; and
  applying the acoustic energy to a plurality of frequency-selective BAW resonators each tuned to a different resonant frequency so that one of the frequency-selective BAW resonators will generate an electrical signal if the acoustic energy generated by the broadband BAW resonator contains spectral components at its predetermined resonant frequency.

* * * * *

UNITED STATES PATENT AND TRADEMARK OFFICE
CERTIFICATE OF CORRECTION

PATENT NO. : 7,276,892 B2  Page 1 of 1
APPLICATION NO. : 11/119285
DATED : October 2, 2007
INVENTOR(S) : William Trutna It is certified that error appears in the above-identified patent and that said Letters Patent is hereby corrected as shown below:

Col. 4 Line 28 In Claim 5, delete "Al203" and insert -- $Al_2O_3$ --, therefor.

Col. 5 Line 3 In Claim 14, delete "Al203" and insert -- $Al_2O_3$ --, therefor.

Signed and Sealed this

Twenty-fourth Day of February, 2009

JOHN DOLL
*Acting Director of the United States Patent and Trademark Office*